(12) United States Patent
Marino et al.

(10) Patent No.: US 8,232,781 B2
(45) Date of Patent: Jul. 31, 2012

(54) DEVICE FOR MEASURING THE CURRENT FLOWING THROUGH A POWER TRANSISTOR OF A VOLTAGE REGULATOR

(75) Inventors: Filippo Marino, Tremestieri Etneo (IT); Marco Minieri, Catania (IT); Gaetano Petrina, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 530 days.

(21) Appl. No.: 12/343,172

(22) Filed: Dec. 23, 2008

(65) Prior Publication Data
US 2010/0156379 A1 Jun. 24, 2010

(51) Int. Cl.
*G05F 1/00* (2006.01)
(52) U.S. Cl. ......... 323/271; 323/282; 323/284; 323/316
(58) Field of Classification Search .................. 323/272, 323/282, 312, 313, 314, 315
See application file for complete search history.

(56) References Cited

U.S. PATENT DOCUMENTS

| 5,900,776 | A * | 5/1999 | Gay ............................... 327/543 |
| 6,424,131 | B1 * | 7/2002 | Yamamoto et al. ........... 323/282 |
| 6,700,361 | B2 * | 3/2004 | Gregorius ..................... 323/282 |
| 7,479,771 | B2 * | 1/2009 | Ryu et al. ...................... 323/271 |
| 7,557,557 | B2 * | 7/2009 | Sugie et al. ................... 323/316 |
| 7,816,897 | B2 * | 10/2010 | Illegems ........................ 323/277 |
| 2006/0028192 | A1 * | 2/2006 | Ryu et al. ...................... 323/312 |
| 2009/0051336 | A1 * | 2/2009 | Hartlieb et al. ............... 323/282 |

* cited by examiner

*Primary Examiner* — Adolf Berhane
*Assistant Examiner* — Lakaisha Jackson
(74) *Attorney, Agent, or Firm* — Seed IP Law Group PLLC

(57) ABSTRACT

A device for measuring the current flowing through a power transistor of a voltage regulator, the voltage regulator having an input voltage and providing a regulated output voltage and the power transistor coupled between the input and output voltages. The measuring device includes a further transistor adapted to mirror a portion of the current flowing through the power transistor, the further transistor and the power transistor have a first non-drivable terminal in common that is coupled to the input voltage. The measuring device also includes a circuit block to connect the second non-drivable terminals of the power and the further transistor and to provide an output current equal to the portion of the current flowing through the first transistor; the measuring device further including a circuit adapted to detect the output current of said circuit block.

16 Claims, 2 Drawing Sheets

DEVICE FOR MEASURING THE CURRENT FLOWING THROUGH A POWER TRANSISTOR OF A VOLTAGE REGULATOR

BACKGROUND

1. Technical Field

The present disclosure refers to a device for measuring the current flowing through a power transistor of a voltage regulator.

2. Description of the Related Art

The use of a device to measure a current flowing through a MOS power transistor connected between the non-regulated input voltage and the regulated output voltage is known in the state of the art; the measurement effectuated by the device allows to limit the current flowing through the power MOS transistor.

A linear voltage regulator according to a prior design is shown in FIG. 1. The regulator includes a MOS power transistor M1 having the drain terminal coupled with an input voltage Vin and the source terminal connected with one terminal of a capacitor CI, connected in parallel to a resistance RI, and having the other terminal connected to ground GND; the output voltage Vout is present across the terminals of the capacitor CI. A voltage divider constituted by two resistance R1 and R2 is arranged parallel to the capacitor CI so that the voltage Vfb, which is a portion of the voltage Vout, is at the input inverting terminal of an error amplifier 1 having the reference voltage Vref at the input non-inverting terminal. The error amplifier 1 is adapted to amplify the difference between the voltages Vref and Vfb, and the output voltage Ver is at the input of a driver 2 generating the voltage Vg for driving the MOS power transistor M1. The error amplifier 1 and the driver 2 are supplied by a supply voltage Vdd and are connected to ground GND.

A limitation circuit is present in the voltage regulator of FIG. 1, which includes a MOS transistor Ms adapted to mirror a portion of the current flowing through the MOS transistor M1. The MOS transistor Ms is of the same type as the MOS transistor M1 and has a smaller size. The size of the transistor Ms is W/L, wherein W/L is the form factor, while the size of the transistor M1 is n*W/L where W and L are the width and the length of the channel. The MOS transistor Ms has the drain terminal connected with the input voltage Vin by means of a resistance Rs and the source terminal is directly connected with the source terminal of the MOS transistor M1. The voltage across the resistance Rs is at the input of another error amplifier 3 having another reference voltage Vrefm at the input. The voltage generated by the error amplifier 3 is sent to the gate terminal of the MOS transistor M1.

This technology is not adapted to the voltage regulators wherein the power MOS transistor M1 has a small on resistance and is capable of providing currents on the order of the Ampere. In fact, the resistance Rs would be of the order of some milliohm to not change the measurement. The power MOS transistor operates in the triode zone when the drain-source voltage Vds is equal to the difference between the gate-source voltage Vgs and the threshold voltage Vt. Since the transistors M1 and Ms are of the same type, they have the same threshold voltage Vt. Also, since the source terminals of the transistors M1 and Ms are in common and the transistors M1 and Ms are driven by the same control signal Vg, the transistors M1 and Ms have the same gate-source voltage. The transistor Ms goes into the triode zone before the transistor M1 because of the voltage across the resistance Rs. In fact the drain-source voltage Vdss of the transistor Ms is Vdss=Vds−Rs*Iload/(n+1) where Iload is the output current. For this reason the mirror rate is not constant, and this introduces a large error on the measurement. This error cannot be reduced by using a small resistance Rs because the error amplifier has a limited sensitivity.

BRIEF SUMMARY

In view of the state of the art, the present disclosure provides a device for measuring the current flowing through a power transistor of a voltage regulator that overcomes the advantages of the known devices.

According to the present disclosure, a device for measuring the current flowing through a power transistor of a voltage regulator is provided. The voltage regulator has an input voltage and provides a regulated output voltage, and said power transistor is coupled between the input and output voltage. The measuring device includes a further transistor adapted to mirror a portion of the current flowing through the power transistor, said further transistor and said power transistor having a first non-drivable terminal in common that is coupled to the input voltage. The measuring device includes a circuit block capable of virtually connecting the second non-drivable terminals of the power and the further transistor and to provide an output current equal to the portion of the current flowing through the further transistor. The measuring device also includes a circuit adapted to detect the output current of the circuit block.

In accordance with another aspect of the present disclosure it is possible to provide a device for limiting the current flowing through a power transistor of a voltage regulator, the voltage regulator having an input voltage and providing a regulated output voltage and the power transistor being coupled between the input and output voltage. The limitation device includes a further transistor adapted to mirror a portion of the current flowing through the power transistor, the further transistor and the power transistor having a first non-drivable terminal in common, which is coupled to the input voltage, the limitation device having a circuit block capable of virtual connection to the second non-drivable terminals of the power transistor and the further transistor and to provide an output current equal to the portion of the current flowing through the further transistor. The limitation device also includes a first circuit adapted to detect the output current of the circuit block, and a second circuit adapted to compare the detected current with a reference current and to generate a signal deriving from the comparison, the signal being used for driving the power transistor so as to limit the current flowing through the power transistor.

In accordance with another embodiment of the present disclosure, a circuit is provided that includes a power transistor having a first terminal adapted to receive an input voltage and to output an output voltage on a second terminal; a first transistor having a first terminal coupled to the first terminal of the power transistor and having a second terminal on which is output a portion of output current of the power transistor; and a circuit block coupled to the first transistor and the power transistor and adapted to couple the second terminal of the power transistor to the second terminal of the first transistor and to output a current equal to the current output of the first transistor.

In accordance with another aspect of the foregoing embodiment, the circuit block further includes a comparison circuit coupled to the circuit block that compares the output current of the circuit block with a reference current and generates in response to the comparison a signal used to drive the power transistor to control current flowing through the power transistor.

In accordance with another aspect of the foregoing embodiment, the circuit block includes an operational amplifier having a non-inverting terminal coupled to the second terminal of the power transistor and an inverting terminal coupled to the second terminal of the first transistor, the circuit block further including another transistor driven by the output signal of the operational amplifier and having a first non-drivable terminal coupled to the second terminal of the first transistor and a second non-drivable terminal forming an output of the circuit block. The power transistor and the first transistor may be driven by a same driving signal.

BRIEF DESCRIPTION OF THE SEVERAL VIEWS OF THE DRAWINGS

The features and advantages of the present disclosure will become clear from the following detailed description of an embodiment thereof illustrated by way of non-limiting example in the attached drawings, in which.

DETAILED DESCRIPTION

Figure 1:
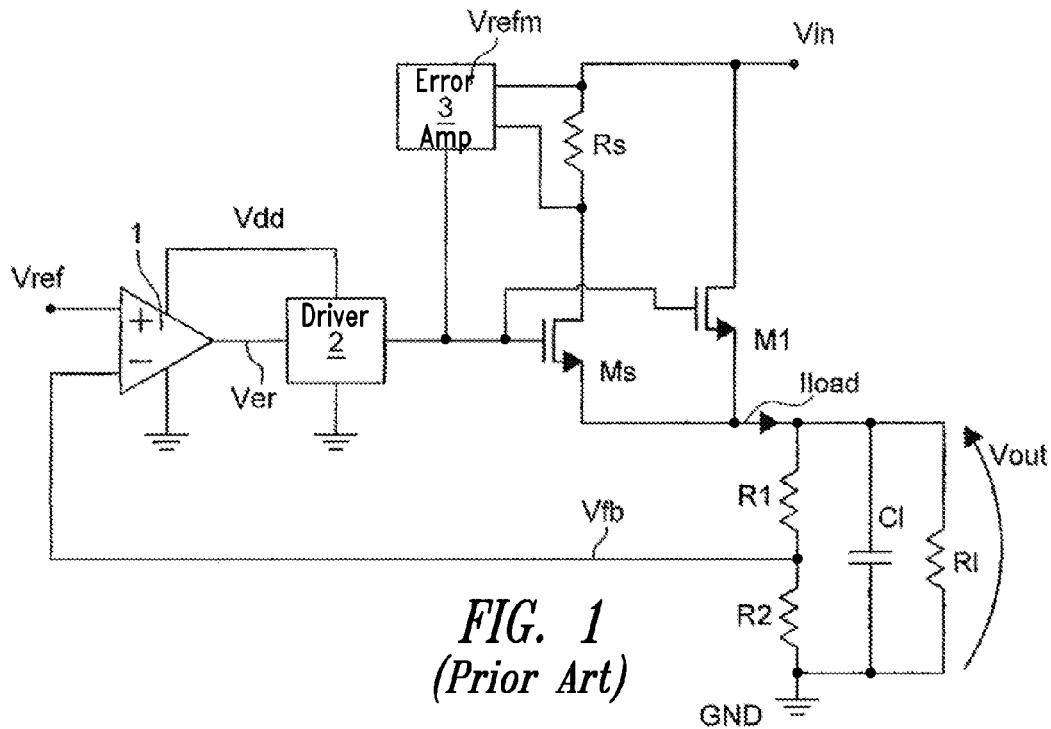
FIG. 1 is a schematic view of a voltage regulator according to a prior design.

For the sake of convenience, reference numbers common to elements of FIG. 1 are used throughout the remaining figures.

Figure 2:
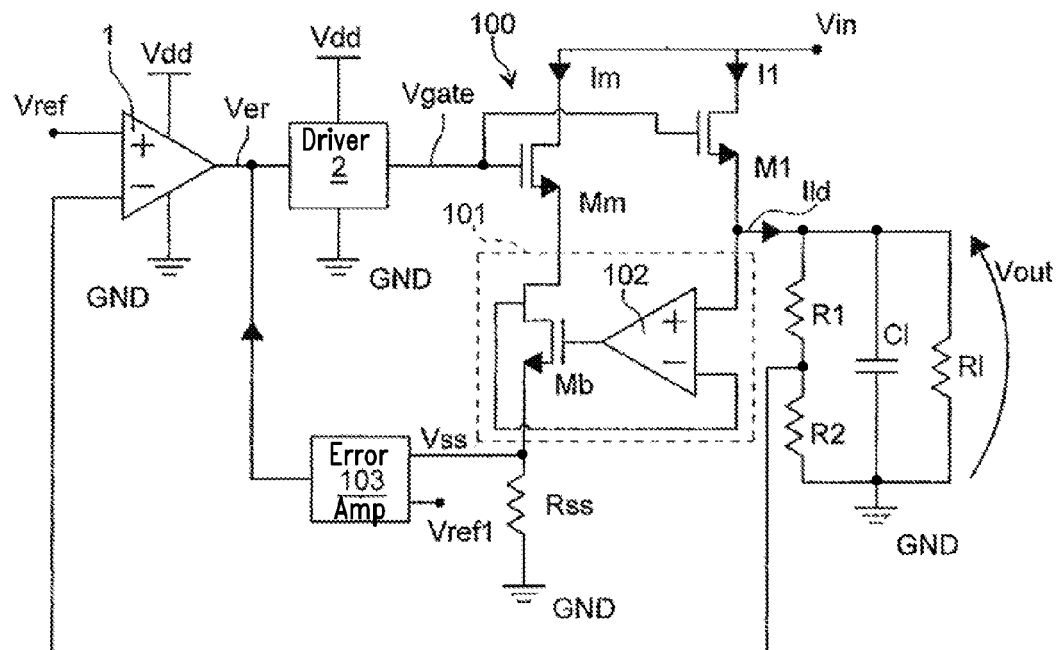
FIG. 2 is a schematic view of a device for measuring the current flowing through a power transistor of a voltage regulator according to an embodiment of the present disclosure.

FIG. 2 is a schematic view of a device for measuring the current flowing through a power transistor of a voltage regulator according to an embodiment of the present disclosure. The voltage regulator in FIG. 2 includes a MOS power transistor M1 having a drain terminal coupled with an input voltage Vin and a source terminal connected with one terminal of a capacitor CI, connected in parallel to a resistance RI, and having the other terminal connected to ground GND; the output voltage Vout is present across the terminals of the capacitor CI. A voltage divider constituted by two resistance R1 and R2 is arranged parallel to the capacitor CI so that the voltage Vfb, which is a portion of the voltage Vout, is at the input inverting terminal of an error amplifier 1, which has the reference voltage Vref at the input non-inverting terminal. The error amplifier 1 is adapted to amplify the difference between the voltages Vref and Vfb, and the output voltage Ver is at the input of a driver 2 generating the voltage Vgate for driving the power MOS transistor M1; the error amplifier 1 and the driver 2 are supplied by a supply voltage Vdd and are connected to ground GND.

The voltage regulator in FIG. 2 also includes a device 100 for measuring the current I1 flowing through the power transistor M1 of the voltage regulator in accordance with the embodiment of the present disclosure. The measuring device 100 includes a MOS transistor Mm able to mirror a portion Im of the current I1 flowing through the MOS transistor M1. The MOS transistor Mm is of the same type as the MOS transistor M1 and has a smaller size. The size of the transistor Ms is W/L, wherein W/L is the form factor, while the size of the transistor M1 is n*W/L where W and L are the width and the length of the channel. The MOS transistor Mm has the drain terminal connected with the input voltage Vin, the gate terminal driven by the voltage Vgate and the source terminal connected to a circuit block 101 to which the source terminal of the MOS transistor M1 is connected; the MOS transistor M1 and the MOS transistor Mm are preferably n-channel MOS transistors. The circuit block 101 is adapted to virtually or effectively connect the source terminal of the MOS transistor Mm with the source terminal of the MOS transistor M1 and is adapted to provide an output current equal to the current Im flowing through the MOS transistor Mm. Preferably the circuit block 101 includes a buffer configured operational amplifier 102 having the non-inverting input terminal connected with the source terminal of the MOS transistor M1, the input inverting terminal connected with the source terminal of the MOS transistor Mm and the output terminal connected with the gate terminal of a MOS transistor Mb. The MOS transistor Mb has the drain terminal connected to the source terminal of the MOS transistor Mm and with the input inverting terminal of the buffer configured operational amplifier 102, and the source terminal is the output terminal of the circuit block 101.

The output terminal of the circuit block 101 is connected with one terminal of a resistance Rss having the other terminal connected to ground GND. The voltage Vss across the resistance Rss is at the input of an error amplifier 103 having a reference voltage Vref1 at the input. The error amplifier 103 amplifies the difference between the voltages Vss and Vref1 and generates a signal Vlim which is at the input of the driver 2 and is adapted to limit the current I1 flowing through the power transistor M1 of the voltage regulator.

The voltage across the resistance Rss is Vss=Rss*Im=Rss*I1/n where n is the rate between the form factor of the MOS transistor M1 and the form factor of the MOS transistor Mm; n is preferably an integer number. The voltage Vss is compared with the reference voltage Vref1. Preferably the reference voltage Vref1 is obtained with Vref1=Iref1*Rref1 where Iref1 is a reference current and Rref1 is a resistance of the same type as the resistance Rss, and which is manufactured in the same way as the resistance Rss, in order to avoid errors due to temperature variation of the resistances.

The comparison effectuated by the error amplifier 103 acts on the driver 2 for limiting the output current IId of the voltage regulator. The value of the limitation current is Ilim=n*Iref1*Rref1/Rss.

Figure 3A:
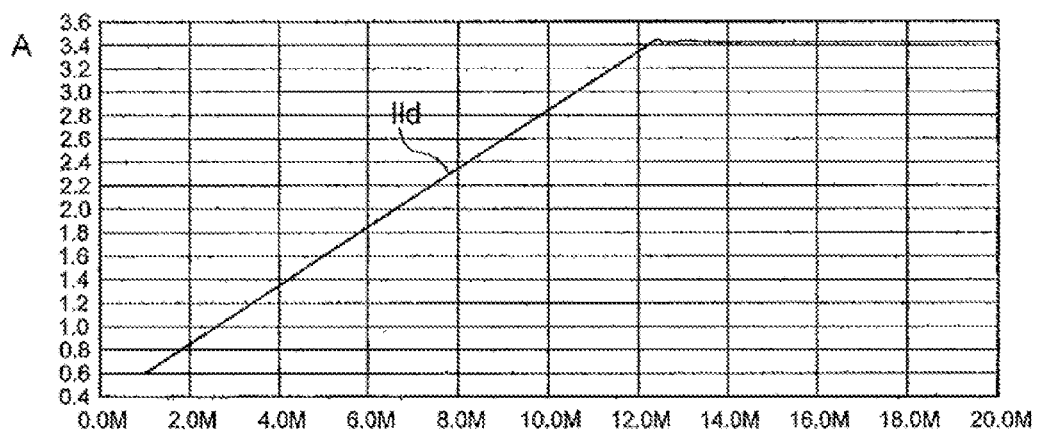
FIGS. 3A-3B are diagrams respectively of the load current and the output voltage of the voltage regulator in FIG. 2.
Figure 3B:
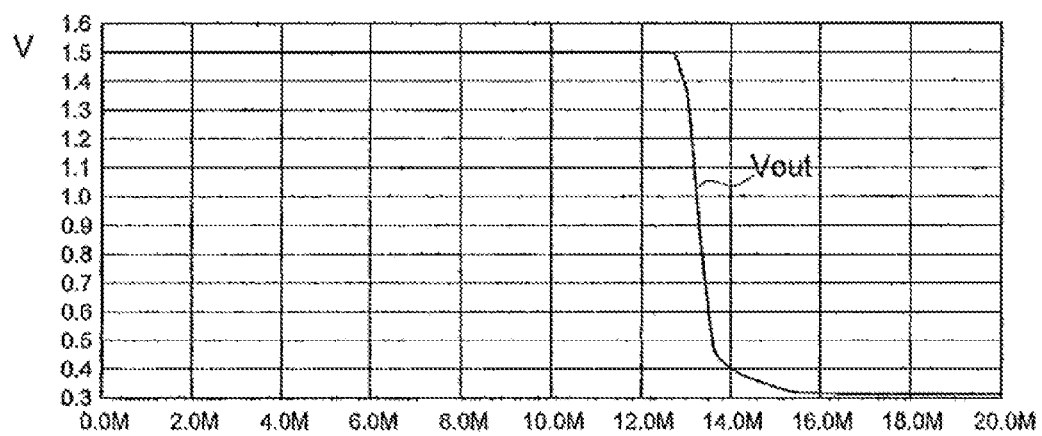

FIGS. 3A-3B show diagrams respectively of the load current IId and the output voltage Vout of the voltage regulator in FIG. 2 during a variation of the current IId of 600 mA at the limitation value of 3.5 A.

The MOS transistors M1 and Mm show an error Der due to the different early voltage of the two transistors. This error is small in the transistor saturation zone but is large in the triode zone, that is, when the on resistance Rdson is large. In fact, when the drain-source voltage Vds falls under a given value, the mirror rate n between the transistors M1 and Mm is reduced; this determines the intervention of the limitation device at a value of the load current IId under the predetermined limitation value Ilim.

Figure 4:
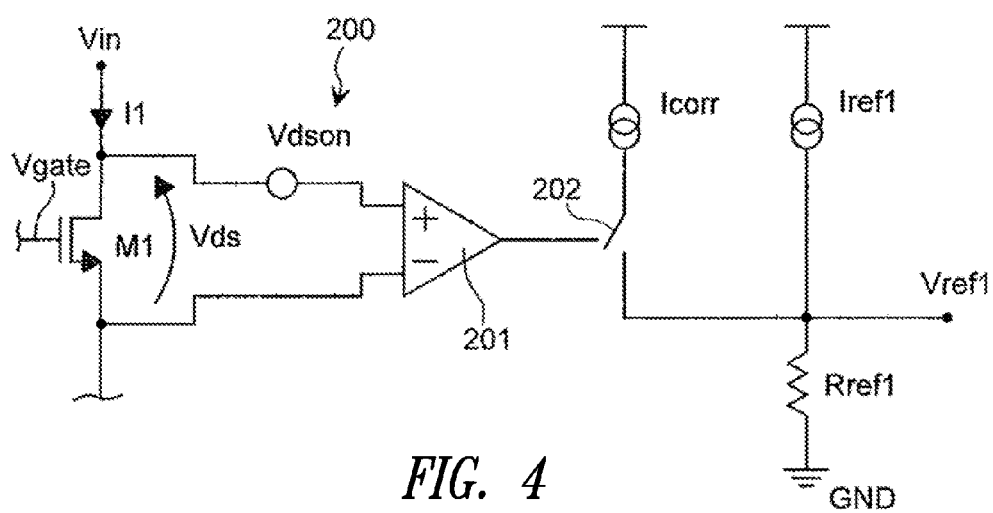
FIG. 4 shows a variant of the embodiment of the present disclosure.

For this reason a variant of the embodiment of the present disclosure has been introduced. A circuit 200 shown in FIG. 4 has been added to the limitation device in FIG. 2. The circuit 200 modifies the limitation current Ilim by acting on the current Iref1 only when the drain-source voltage Vds of the transistor M1 is less than the reference voltage Vdson. The circuit 200 includes a comparator 201 adapted to compare the drain-source voltage Vds and the reference voltage Vdson. The output signal of the comparator 201 acts on a switch 202 when the drain-source voltage Vds is less than the reference voltage Vdson and it is obtained that a current value Icorr is added to the reference current Iref1 so that Vref1=(Iref1+Icorr)*Rref1. In this way the limitation device can intervene at the correct value of the load current.

The present disclosure enables implementation of the current limitation in a regulator with ultra low drop-out because the MOS transistors M1 and Mm have the respective drain, source, and gate terminals at the same potential. Also the supply voltage of the error amplifier is uncoupled to the input voltage.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A measuring device for measuring current flowing through a power transistor of a voltage regulator, the measuring device comprising:
    a first transistor adapted to mirror a current through the power transistor, the first transistor having a first conduction terminal, a second conduction terminal, and a control terminal, the first conduction terminal being coupled to an input voltage terminal and configured to be coupled to a first conduction terminal of the power transistor;
    a coupling circuit structured to couple the second conduction terminal of the first transistor to a second conduction terminal of the power transistor and to provide an output quantity corresponding to a current through the first transistor;
    an error amplifier circuit structured to compare the output quantity of the coupling circuit and a reference quantity and to output an error signal
    a driver circuit having an input coupled to the error amplifier circuit and an output configured to be coupled to a control terminal of the power transistor and structured to limit current through the power transistor in response to the error signal from the error amplifier circuit; and
    a reference quantity modification circuit configured to be coupled to the power transistor and structured to modify the reference quantity in response to determining that a voltage across the power transistor is less than a threshold voltage.

2. The measuring device according to claim 1, further comprising a resistance connected between an output terminal of the coupling circuit and ground.

3. The measuring device according to claim 1 wherein the coupling circuit comprises:
    a buffer-configured operational amplifier having a non-inverting terminal configured to be coupled to the second conduction terminal of the power transistor and an inverting terminal coupled to the second conduction terminal of the further transistor; and
    a second transistor structured to be driven by an output signal of the operational amplifier and having a first conduction terminal coupled to the second conduction terminal of the first transistor and the second conduction terminal forming an output terminal of the coupling circuit.

4. The measuring device according to claim 3 wherein the second transistor is a MOS transistor having drain and source terminals and the first conduction terminal of the second transistor is the drain terminal and the second conduction terminal of the second transistor is the source terminal.

5. The measuring device according to claim 1 wherein the reference quantity modification circuit includes:
    a comparator structured to compare a drain-source voltage of the power transistor with the threshold voltage and to output a comparison signal;
    a resistance configured to provide a reference voltage as the reference quantity; and
    a current source circuit that includes a switch having a control terminal coupled to the comparator, the current source circuit being structured to provide a modified current to the resistance and thereby modify the reference voltage.

6. The measuring device according to claim 1 wherein the control terminal of the first transistor is configured to be coupled to the control terminal of the power transistor.

7. A device for limiting current flowing through a power transistor of a voltage regulator, the device comprising:
    a first transistor structured to mirror a current through the power transistor, the first transistor having a first conduction terminal, a second conduction terminal, and a control terminal, the first conduction terminal being coupled to an input voltage terminal and configured to be coupled to a first conduction terminal of the power transistor;
    a coupling circuit structured to couple the second conduction terminal of the first transistor to a second conduction terminal of the power transistor and to provide an output current equal to a current through the first transistor;
    a first circuit adapted to provide an output voltage corresponding to the output current;
    a second circuit adapted to compare the output voltage with a reference voltage and to generate a comparison signal;
    a driver circuit having an input coupled to the second circuit and an output configured to be coupled to a control terminal of the power transistor and structured to drive the power transistor so as to limit the current through the power transistor in response to the comparison signal; and
    a third circuit coupled to the power transistor and structured to modify the reference voltage in response to determining that a voltage between the first and second conduction terminals of the power transistor is less than a threshold.

8. The limitation device according to claim 7 wherein the first circuit includes a resistance connected between an output terminal of the circuit block and ground.

9. The limitation device according to claim 7 wherein the coupling circuit includes:
    a buffer-configured operational amplifier having a non-inverting terminal configured to be coupled to the second conduction terminal of the power transistor and an inverting terminal coupled to the second conduction terminal of the first transistor; and
    a second transistor structured to be driven by an output signal of the operational amplifier and having a first conduction terminal coupled to the second conduction terminal of the first transistor and a second conduction terminal forming an output terminal of the circuit block.

10. The limitation device according to claim 9 wherein the second transistor is a MOS transistor having drain and source terminals, the first conduction terminal of the second transistor is the drain terminal, and the second conduction terminal is the source terminal.

11. The limitation device according to claim 7 wherein the reference quantity modification circuit includes:
   a comparator structured to compare a drain-source voltage of the power transistor with a threshold voltage and to output a comparison signal;
   a resistance configured to provide the reference voltage; and
   a current source circuit that includes a switch having a control terminal coupled to the comparator, the current source circuit being structured to provide a modified current to the resistance and thereby modify the reference voltage.

12. The limitation device according to claim 7 wherein the control terminal of the first transistor is configured to be coupled to the control terminal of the power transistor.

13. A circuit, comprising:
   a power transistor having a control terminal, a first terminal structured to receive an input voltage, and a second terminal structured to output an output voltage;
   a first transistor having a first terminal coupled to the first terminal of the power transistor and having a second terminal configured to provide a mirror current proportional to an output current of the power transistor;
   a coupling circuit block coupled to the first transistor and the power transistor and adapted to couple the second terminal of the power transistor to the second terminal of the first transistor and to provide an output quantity corresponding to the mirror current;
   a comparison circuit coupled to the coupling circuit, the comparison circuit being structured to compare the output quantity with a reference quantity and to generate a comparison signal;
   a driver circuit coupled to the control terminal of the power transistor and structured to control current flowing through the power transistor in response to the comparison signal; and
   a reference quantity modification circuit coupled to the power transistor and structured to modify the reference quantity in response to determining that a voltage between the first and second conduction terminals of the power transistor is less than a threshold voltage.

14. The circuit of claim 13 wherein the coupling circuit includes:
   an operational amplifier having an output terminal, a non-inverting terminal coupled to the second conduction terminal of the power transistor, and an inverting terminal coupled to the second conduction terminal of the first transistor; and
   a second transistor coupled to the output terminal of the operational amplifier and having a first conduction terminal coupled to the second conduction terminal of the first transistor and a second conduction terminal forming an output terminal of the coupling circuit.

15. The circuit of claim 14 wherein the first transistor has a control terminal coupled to the control terminal of the power transistor and to an output of the drive circuit.

16. The circuit of claim 13 wherein the reference quantity modification circuit includes:
   comparator structured to compare a drain-source voltage of the power transistor with the threshold voltage and to output a comparison signal;
   a resistance configured to provide a reference voltage as the reference quantity; and
   a current source circuit that includes a switch having a control terminal coupled to the comparator, the current source circuit being structured to provide a modified current to the resistance and thereby modify the reference voltage.

* * * * *

UNITED STATES PATENT AND TRADEMARK OFFICE
CERTIFICATE OF CORRECTION

PATENT NO.       : 8,232,781 B2
APPLICATION NO.  : 12/343172
DATED            : July 31, 2012
INVENTOR(S)      : Filippo Marino et al.

It is certified that error appears in the above-identified patent and that said Letters Patent is hereby corrected as shown below:

<u>Column 5, Line 67</u>:
"terminal of the further transistor; and" should read, --terminal of the first transistor; and--.

Signed and Sealed this
Sixth Day of November, 2012

David J. Kappos
*Director of the United States Patent and Trademark Office*